United States Patent
Wu et al.

(10) Patent No.: US 6,605,481 B1
(45) Date of Patent: Aug. 12, 2003

(54) FACILITATING AN ADJUSTABLE LEVEL OF PHASE SHIFTING DURING AN OPTICAL LITHOGRAPHY PROCESS FOR MANUFACTURING AN INTEGRATED CIRCUIT

(75) Inventors: Shao-Po Wu, Portola Valley, CA (US); Seonghun Cho, Santa Clara, CA (US); Yu-Yu Chou, Cupertino, CA (US)

(73) Assignee: Numerical Technologies, Inc., San Jose, CA (US)

( * ) Notice: Subject to any disclaimer, the term of this patent is extended or adjusted under 35 U.S.C. 154(b) by 0 days.

(21) Appl. No.: 10/094,487

(22) Filed: Mar. 8, 2002

(51) Int. Cl.[7] .................... H01L 21/66; G01R 31/26
(52) U.S. Cl. ................................. 438/14; 438/800
(58) Field of Search ................ 438/14–18, 800; 430/5, 311, 312

(56) References Cited

U.S. PATENT DOCUMENTS

| | | | |
|---|---|---|---|
| 5,302,477 A | 4/1994 | Dao et al. | 430/5 |
| 5,308,741 A | 5/1994 | Kemp | 430/312 |
| 5,324,600 A | 6/1994 | Jinbo et al. | 430/5 |
| 5,364,716 A | 11/1994 | Nakagawa et al. | 430/5 |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,858,580 A | 1/1999 | Wang et al. | 430/5 |
| 5,923,562 A | 7/1999 | Liebmann et al. | 364/488 |
| 5,923,566 A | 7/1999 | Galan et al. | 364/489 |

(List continued on next page.)

FOREIGN PATENT DOCUMENTS

| | | |
|---|---|---|
| DE | 195 45 163 A1 | 6/1996 |
| EP | 0 653 679 A2 | 5/1995 |
| GB | 2333613 | 7/1999 |

(List continued on next page.)

OTHER PUBLICATIONS

Kahng, A.B.; Pati, Y.C. "Subwavelength lithography and its potential impact on design and EDA" Proc. 1999 Design Automation Conf. IEEE, Pascataway, NJ, USA, Jun. 21–25, 1999. (abstract).*

(List continued on next page.)

*Primary Examiner*—Craig Thompson
(74) *Attorney, Agent, or Firm*—Park, Vaughn & Fleming LLP (57) ABSTRACT

One embodiment of the invention provides a method that facilitates selectively varying how much of a layout of an integrated circuit is defined by phase shifters during an optical lithography process used in manufacturing the integrated circuit. During operation, the method receives a specification of the layout of the integrated circuit. The method then assigns features within the layout to zones associated with different phase shifting priorities. Next, the method generates a phase shifter placement by placing phase shifters comprised of phase shifting geometries onto a phase shifting mask to define the features within the layout, wherein the phase shifter placement is subject to coloring constraints. Note that in general there is no restriction on the order of zone placement. During this placement process, if coloring constraints cannot be satisfied, the method resolves conflicts and/or removes features from being phase-shifted based upon phase shifting priorities of the zones.

11 Claims, 7 Drawing Sheets

U.S. PATENT DOCUMENTS

| | | | |
|---|---|---|---|
| 5,994,002 A | 11/1999 | Matsuoka | 430/5 |
| 5,998,068 A | 12/1999 | Matsuoka | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| JP | 62067547 | 3/1987 |
| JP | 2-140743 | 5/1990 |
| JP | 1283925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 01/23961 | 4/2001 |
| WO | WO 02/03140 A1 | 1/2002 |
| WO | WO 02/073312 A1 | 9/2002 |

OTHER PUBLICATIONS

Vendenberghe, G. et a. "(Sub–)100 nm gate patterning using 248 alternating PSM." Conference, Photomask and Next-Generation Lithography Mask Technology III. Proc. SPIE—The Int'l Soc. for Optical Engineering v 4409 2001. p61–69. Yokohama, Japan 2001.*

Kawahira, H.; Nagano, V. "Panel Discussion Revier 'high performance devices in the new century'" 20th Ann. BACUS sym. on photomask technology. Proc. of SPIE Int'l Soc. for Optical Engineering 2001 p. 384–394 (abstract).*

Fritze, M. et al. "Enhanced Resolution for Future Fabrication" IEEE Circuits and Devices Magazine v. 19 No. 1 Jan. 2003 p. 43–47.*

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Ackmann, P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

Matsuoka, K., et al., "Application of Alternating Phase–Shifting Mask to 0.16um CMOS Logic Gate Patterns", Matsushita Electric Ind. Co., Ltd. (9 pages).

Wang, R., et al., "Plarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLATencor Corp. (10 pages).

Rosenbluth, A., et al., "Optimum Mask and Source Patterns to Print a Given Shape", IBM (17 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithography", Canon Inc. (13 pages).

Vandenberghe, G., et al., "(Sub–)100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

Terasawa, T., et al., "0.3–Micron Optical Lithography Using a Phase–Shifting Mask", SPIE, Optical/Laser Microlithography II, vol. 1088, pp. 25–33, Mar. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Yamanaka, T., et al., "A 5.9um2 Super Low Power SRAM Cell Using a New Phase–Shift Lighography", IEDM, pp. 18.3.1–18.3.4 (1990).

Inokuchi, K., et al., "Sub–Quarter Micron Gate Fabrication Process Using Phase–Shifting Mask for Microwave GaAs Devices", Extended Abstracts Of The 1991 Intl. Conference On Solid State Devices Aned Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi–Phase–Shifting and Halftone Phase–Shifting Masks", Japanese Journal of Applied Physics, vol. 30, No. 11B, pp. 2992–2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study of Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter-Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Jinbo, H., et al., "Application of Blind Method to Phase–Shifting Lithography", IEEE, 1992 Symposium On VLSI Technology Digest Of Technical Papers, pp. 112–113 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Pierrat, C., et al., "Phase–Shifting Mask Topography Effects on Lithographic Image Quality", IEEE, pp. 3.3.1–3.3.4 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Lin, B.J., "Phase–Shifting Masks Gain an Edge", IEEE Circuits & Devices, pp. 28–35, Mar. 1993.

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2–16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automtic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243–249 (1997).

Morimoto, H., et al., "Next Generation Mask Strategy— Technologies are Ready for Mass Production of 256MDRAM?", SPIE, vol. 3236, pp. 188–189 (1997).

Roman, B., et al., "Implications of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Ohnuma, II., et al., "Lithography Computer Aided Design Technology for Embedded Memory in Logic", Jpn. J. Appl. Phys., vol. 37, Part I, No. 12B, pp. 6686–6688, Dec. 1998.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Perfomance 0.10um CMOS Process", The 44th International Conference on Electron, Ion and Photon Beam Technology and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alt–PSMs", Optical Microlithography XIII, Proceeding of SPIE, vol. 4000, pp. 121–131 (2000).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Liebmann, L.W., et al., "TCAD Development For Lithography Resolution Enhancement", IBM J. Res. & Dev., vol. 45, No. 5, pp. 651–665, Sep. 5, 2001.

* cited by examiner

FACILITATING AN ADJUSTABLE LEVEL OF PHASE SHIFTING DURING AN OPTICAL LITHOGRAPHY PROCESS FOR MANUFACTURING AN INTEGRATED CIRCUIT

BACKGROUND

1. Field of the Invention

The invention relates to the process of designing and fabricating semiconductor chips. More specifically, the invention relates to a method and an apparatus for selectively varying how much of a layout is defined by phase shifters during an optical lithography process for manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise during the optical lithography processes that are used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "reticle.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching/implanting on underlying regions of the wafer.

Phase shifters are often incorporated into a mask in order to achieve line widths that are smaller than the wavelength of the light that is used to expose the photoresist layer through the mask. During phase shifting, destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the light exiting the material of thickness $t_2$ is 180 degrees out of phase with the light exiting the material of thickness to. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999.

Figure 1:
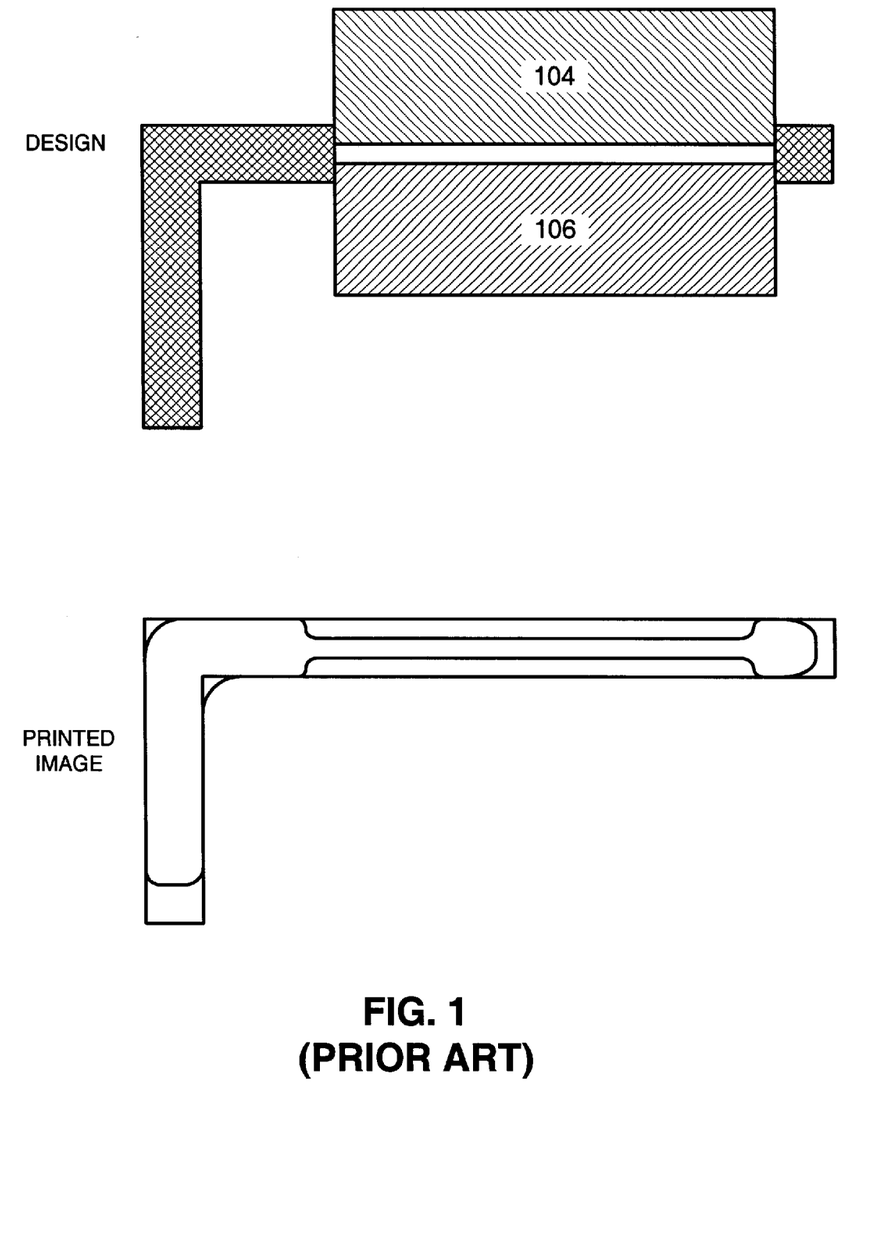
FIG. 1 illustrates the use of a phase shifter to define a transistor gate.
Figure 2:
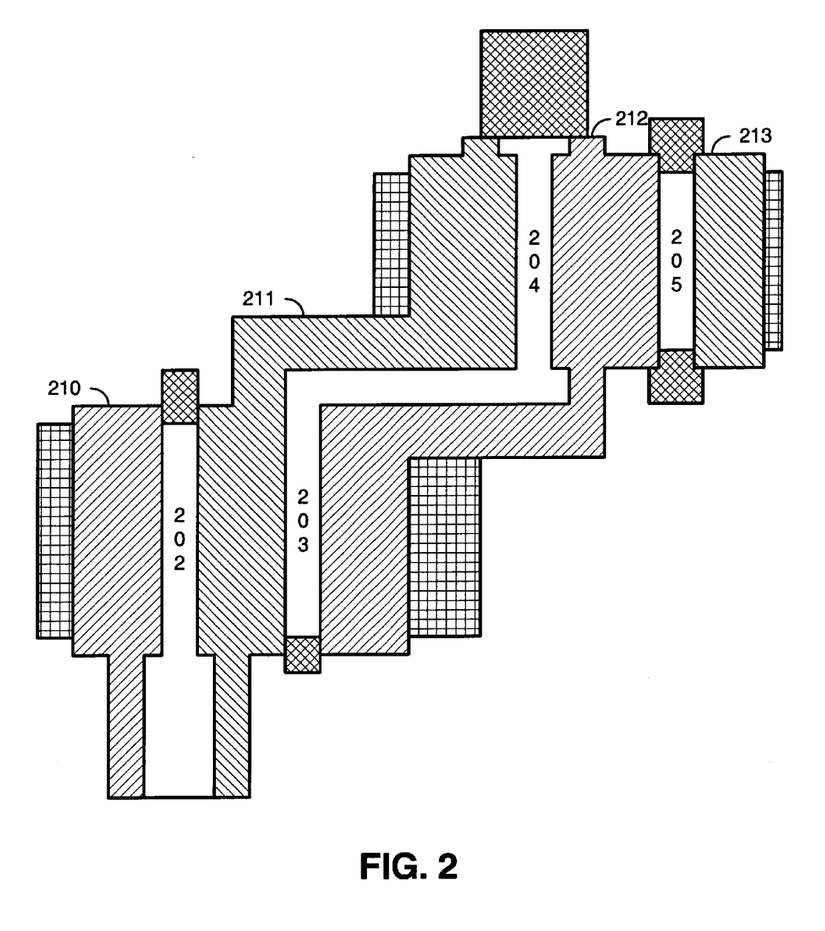
FIG. 2 illustrates the use of phase shifters to define multiple transistor gates in accordance with an embodiment of the invention.

For example, FIG. 1 illustrates how a phase shifter comprised of a zero-degree clear region 104 and a 180-degree clear region 106 is used to achieve a smaller line width for a gate region of a transistor. As circuit dimensions on semiconductor chips become progressively smaller, phase shifters are presently being used to define other critical-dimension features in addition to transistor gates. FIG. 2 illustrates how phase shifters are additionally used to define interconnections between phase shifters. For example, in FIG. 2 phase shifters 210–213 are used to define the gates of four different transistors 202–205 in the circuit layout. However, phase shifters 210–212 additionally extend past these gate regions to additionally define interconnections between the gates. Note that in FIG. 2, phase shifters are represented by diagonal lines, non-phase-shifted features are represented by cross-hatching, phase-shifted regions are clear and diffusion regions are represented by a grid pattern.

Note that FIG. 1 and FIG. 2 do not show masks, but rather a composite layout showing the resultant design and the phase shift areas. In order to produce these features, two masks are generally used: one dark field mask with the phase shifters; and the other a complementary trim mask with protection for regions defined by the phase shifting mask and to define cross-hatched areas.

Phase shifting is used to define the gate regions of transistors. However, as feature sizes continue to decrease, it is becoming increasingly desirable to use phase shifters to define other features of an integrated circuit.

Unfortunately, as phase shifters are used define more critical dimension features, coloring conflicts are likely to arise between phase shifters. Phase shifters operate by creating interference patterns between zero-degree clear regions and 180-degree clear regions. Coloring conflicts arise when nearby phase shifting regions have the same phase. For example, when a first zero-degree clear region is in close proximity to a second zero-degree clear region, light from the first clear region reinforces light from the second clear region on the photoresist layer between the first and second clear regions. This can cause unwanted exposure of the photoresist layer.

In order to prevent this problem, systems that lay out, or design, phase shifting layouts typically perform tests to ensure that coloring conflicts do not occur. When a coloring conflict is detected, phase shifters are either removed or reduced in size through a manual process to mitigate the coloring conflict. This manual process can be extremely time-consuming, especially when large numbers of phase shifters are involved. Moreover, it is difficult to determine how much of a circuit layout can be phase shifted without creating coloring conflicts.

What is needed is a method and an apparatus that facilitates automatically performing phase shifting on as much of a circuit layout as is possible without creating coloring conflicts.

SUMMARY

One embodiment of the invention provides a system that facilitates selectively varying how much of a layout of an integrated circuit is defined by phase shifters during an optical lithography process used in manufacturing the integrated circuit. During operation, the system receives a specification of the layout of the integrated circuit. The system then assigns features within the layout to zones associated with different phase shifting priorities. Next, the system generates a phase shifter placement by placing phase shifters comprised of phase shifting geometries onto a phase shifting mask to define the features within the layout, wherein the phase shifter placement is subject to coloring constraints. Note that in general there is no restriction on the order of zone placement. (For example, it is possible to place all zones first before verifying colorability.) During this placement process, if coloring constraints cannot be satisfied, the system resolves conflicts and/or removes features from being phase-shifted based upon phase shifting priorities of the zones.

In a variation on this embodiment, the system receives a phase shifting level from a user interface element, and uses this phase shifting level to determine which zones are subject to phase shifting based on a priority ordering, wherein zones of higher priority are phase shifted before zones of lower priority. This user interface element can include: a slider, a set of buttons, a pulldown menu, or an input field. In other embodiments, the input is provided from one or more data files.

In a variation on this embodiment, assigning the features to zones involves applying a set rules that specify how to assign features to zones. In a further variation, the system assigns features to zones based on at least one of: feature type (e.g., gates, interconnects, metal, etc.), feature dimension (e.g., feature width, feature length, etc.), specific feature interaction with layer (e.g., feature overlapping with specific layer in layout), and feature proximity to predefined features (e.g., interconnect within certain range from gate).

In a variation on this embodiment, while placing the phase shifters, the system uses a phase shifter width associated with a phase shifting zone.

In a variation on this embodiment, the system additionally performs a coloring operation to determine whether the phase shifter placement causes a phase shifter conflict. If a phase shifter conflict is detected, the system scales back the phase shifter placement to eliminate the phase shifter conflict. This process of scaling back the phase shifter placement can involve removing phase shifters from a zone of lowest priority that has been phase shifted so far, or changing placement parameters for one or more phase shifting zones.

In a variation on this embodiment, placing phase shifters involves iteratively placing phase shifters for zones starting with a zone of highest priority and proceeding in descending priority order to zones of lower priority until a coloring conflict is encountered.

In a variation on this embodiment, the system runs a test mask through the optical lithography process and/or a simulation of all or part of the process to produce test results, and uses the test results to generate a set of rules specifying how to assign features to zones. The system also uses the test results to generate phase shifter widths for the zones.

DETAILED DESCRIPTION

Wafer Fabrication Process

Figure 3:
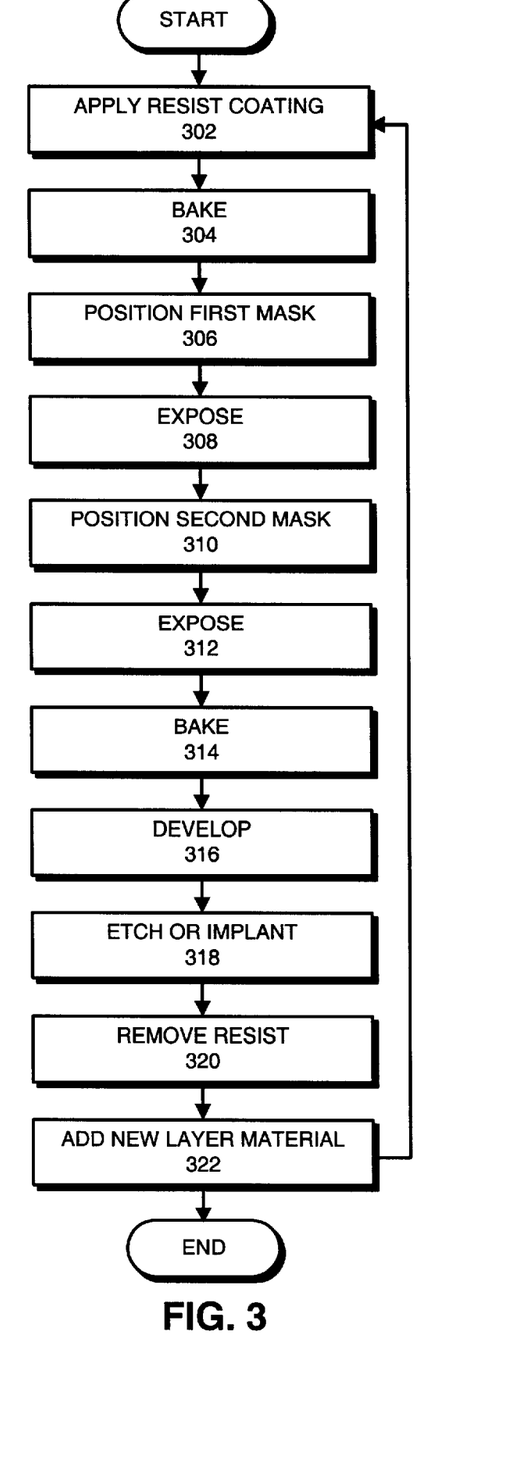
FIG. 3 is a flow chart illustrating the wafer fabrication process in accordance with an embodiment of the invention.

FIG. 3 is a flow chart illustrating the wafer fabrication process in accordance with an embodiment of the invention. The system starts by applying a photoresist layer to the top surface of a wafer (step 302). Next, the system bakes the photoresist layer (step 304). The system then positions the first mask over the photoresist layer (step 306), and then exposes the photoresist layer through the first mask (step 308). Next, the system positions the second mask over the photoresist layer (step 310), and then exposes the photoresist layer through the second mask (step 312). Note that the first mask and/or the second mask can include phase shifting regions.

The system then bakes the wafer again (step 314) before developing the photoresist layer (step 316). Next, either a chemical etching or ion implantation step takes place (step 318) before the photoresist layer is removed (step 320). Finally, a new layer of material can be added and the process can be repeated for the new layer (step 322).

Phase Shifter Generation

Figure 4:
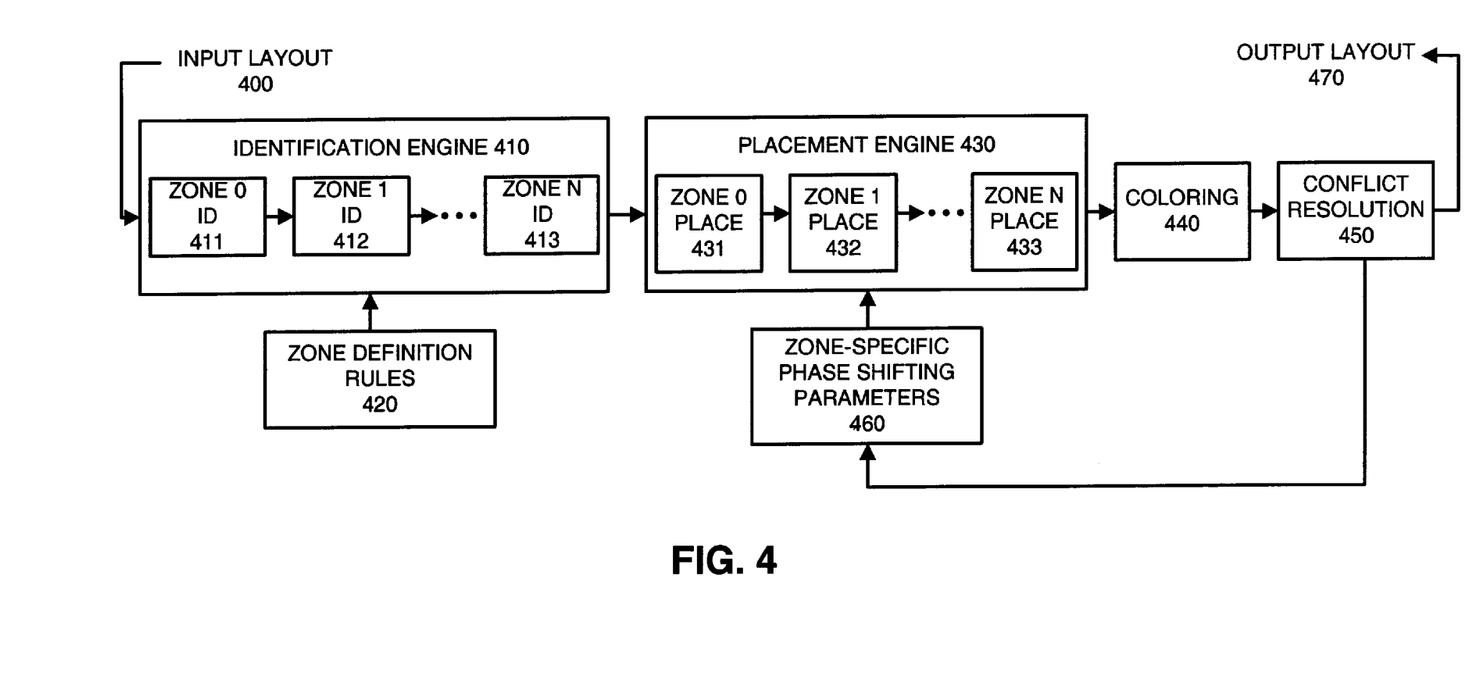
FIG. 4 illustrates how phase shifters are generated for a layout in accordance with an embodiment of the invention.

FIG. 4 illustrates how phase shifters are generated for a layout in accordance with an embodiment of the invention. Upon receiving an input layout 400 from a database, file server, network, and/or other source, the identification engine 410 uses zone definition rules 420 to identify critical dimension features and to assign critical dimension features to zones. Identification engine 410 assigns critical dimension features to zones starting with features that belong to zone 0 (box 411) and zone 1 (box 412) and proceeding to zone N (box 413). Note that the zones have a priority ordering starting with zone 0, which has the highest priority, and proceeding in a descending priority ordering through zone 1 and zone 2, and ultimately to zone N, which has the lowest priority.

Critical dimension features include polysilicon features, such as a transistor gate, a polysilicon feature with a dimension that falls within a prespecified range, a polysilicon line in close proximity to a gate, a polysilicon line in close proximity to a short gate, a polysilicon line with turns, a polysilicon line with turns in close proximity to a gate, or a polysilicon line in close proximity to a phase shifter.

Moreover, critical dimension features can include metal features, such as a metal feature with a dimension that falls within a pre-specified range, a metal line with turns, or a metal line that is shorter than a pre-specified length. Critical dimension features can similarly include diffusion regions.

In one embodiment of the invention, all features, polygons, or portions of a polygon are within the layout divided into two categories according to a set of pre-defined rules: those are not to be phase-shifted; and those "may" be phase-shifted. Next, the features that may be phase-shifted are divided according to the rules into multiple zones. Hence, not necessarily all features in a layout will have a zone assigned to them.

"Critical features" are features must be phase-shifted. There are at least two ways of "zoning" critical features. (1)

They can all be zoned with the highest priority. This means that they will be assigned with the same shifter settings. (2) Or, they can be assigned to various zones. This means we need to address the priority between critical and non-critical features of the same zone.

In one embodiment of the invention, by properly choosing the zone definitions, we can address phase-shifting for various features. For example, we can define zones corresponding to critical-dimensional gates, fast gates, low-power gates, critical interconnect paths, . . . , etc. Each of these zones requires different phase-shifting settings to suit different targets. In this way, the system automatically applies the "right" phase-shifting to various types of features, instead of addressing the priority/aggressiveness of phase-shifting.

Next, after critical dimension features are assigned to zones, placement engine 430 places phase shifters on a phase shifting mask to define the critical features. Placement engine 430 does so by placing phase shifters for zones in turn starting from zone 0 (box 431) and zone 1 (box 432), and proceeding to zone N (box 433). In doing so, placement engine 430 uses zone-specific phase shifting parameters 460 to determine attributes of the phase shifters. For example, zone-specific phase shifting parameters may specify that zone 0 phase shifters are 500 nm in width, zone 1 phase shifters are 350 nm in width, zone 2 phase shifters are 250 nm in width, and zone 3 phase shifters are 200 nm in width.

Next, the system performs a coloring operation 440 by generating a coloring graph based on the placement of the phase shifters. The system then performs a coloring operation which involves a graph traversal. During this coloring operation, the system determines if there is a coloring conflict between the phase shifters. If no conflict is detected during this coloring operation, the system assigns phases to the phase shifters to produce one or more output layouts 470 that are stored in the database, files, over the network, and/or in some other medium. Note that FIG. 4 and FIG. 6 (described below) represent two different embodiments of zoning flow for the invention.

Otherwise, if one or more coloring conflicts are detected, the system performs a conflict resolution operation 450. This conflict resolution operation 450 may involve removing phase shifters. It may also involve changing the zone-specific phase shifting parameters 460 and running placement engine 430 again to regenerate some phase shifters in modified form. In general, this conflict resolution operation can involve many different conflict resolution techniques, such as reducing shifter dimensions, cutting connecting shifters to break phase-conflict cycles, and enlarging feature dimensions so that phase shifting at the location is not necessary.

Test Mask

Figure 5:
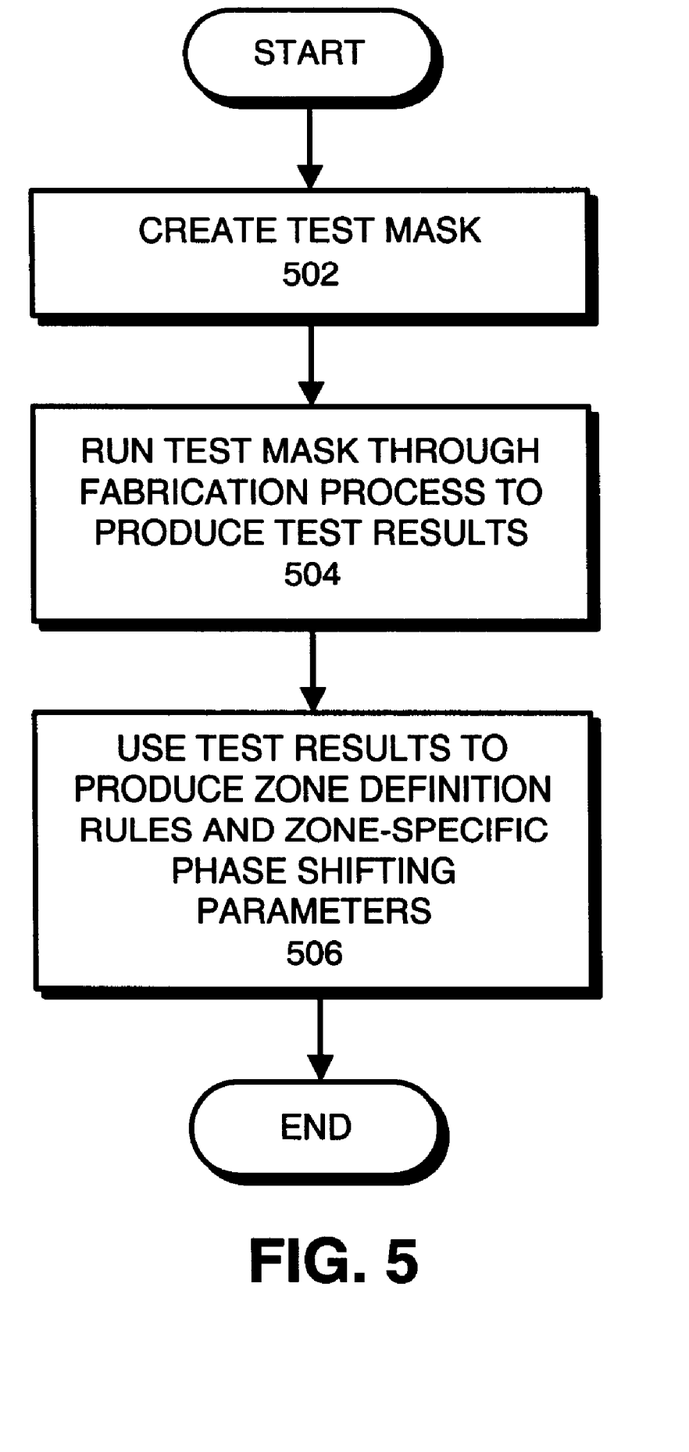
FIG. 5 is a flow chart illustrating the process of using a test mask to produce zone definition rules and zone parameters in accordance with an embodiment of the invention.

FIG. 5 is a flow chart illustrating the process of using a test mask to produce zone definition rules and zone parameters in accordance with an embodiment of the invention. The process starts by creating a test mask that includes features of varying dimensions (step 502). Next, the test mask is run through a wafer fabrication process to produce test results (step 504). These test results are then used to produce zone definition rules 420 and zone-specific phase shifting parameters 460 (step 506). These zone definition rules 420 and zone-specific phase shifting parameters 460 are then used by the phase shifter generation process to generate a phase shifter placement as is described above with reference to FIG. 4.

In some embodiments, the process of step 504 can be partially or totally replaced with the use of simulation results. For example, in some embodiments, simulation results are initially used to refine the features of the test mask and generate preliminary results. For example, in some embodiments, a model that has been calibrated from resist and/or etch/implant measurements is used to perform the simulation. In that case, the simulation results may be adequate for determining phase shifting parameters at step 506.

Phase Shifter Placement

Figure 6:
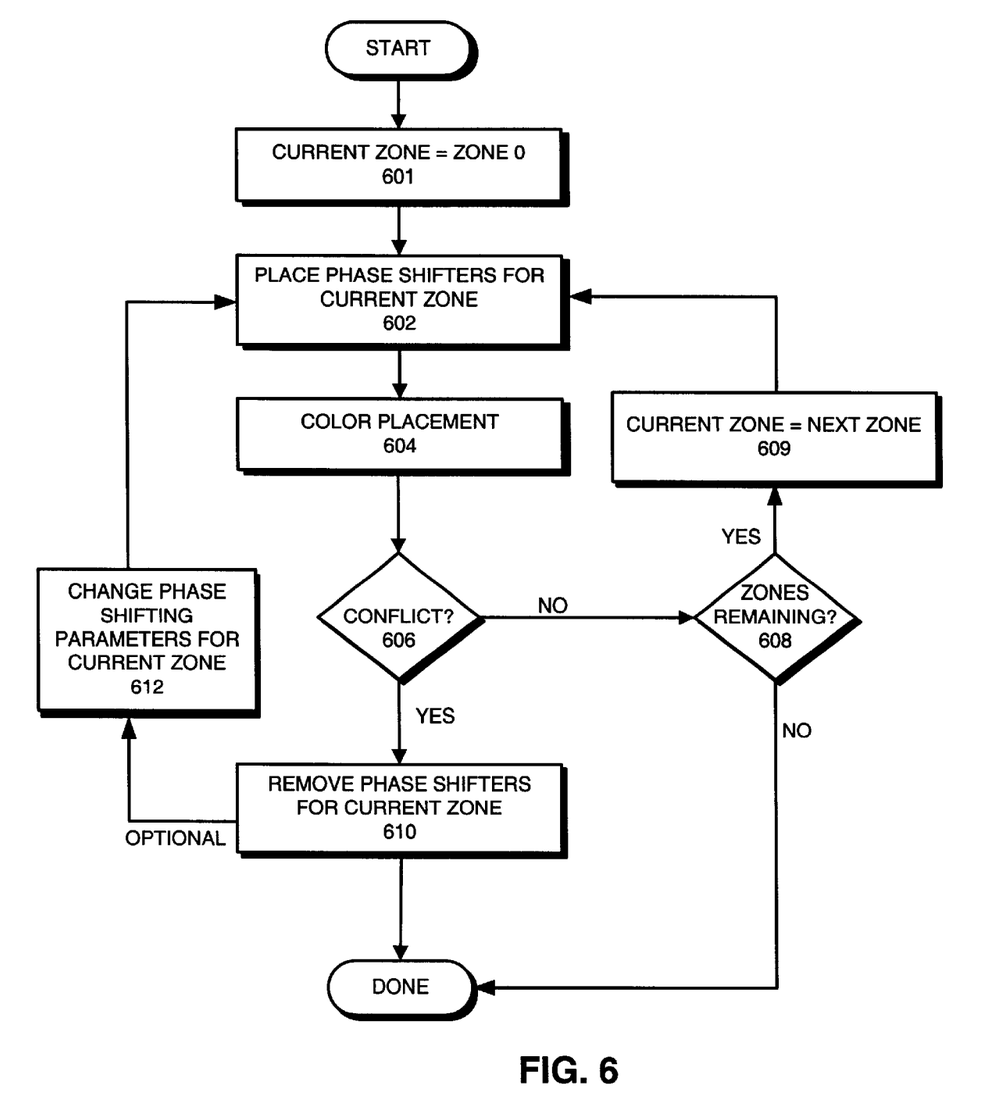
FIG. 6 is a flow chart illustrating an iterative process for placing phase shifters based upon zones in accordance with an embodiment of the invention.

FIG. 6 is a flow chart illustrating an iterative process for placing phase shifters based upon zones in accordance with an embodiment of the invention. This flow chart illustrates the operation of placement engine 430 described with reference to FIG. 4 above. The system starts by initializing a current zone to be zone 0 (step 601). Next, the system places phase shifters for the current zone (step 602). This may include looking up one or more zone-specific phase shifting parameters, such as, target shifter width, minimum shifter width, shifter extension, and shifter minimum spacing for the current zone.

Then system then performs a coloring operation on the placement (step 604) to detect coloring conflicts (step 606). In some embodiments only relative phase assignment/coloring is performed at step 604. In other embodiments, only conflict checking is performed without the need to complete a coloring. If a coloring conflict does not exist, the system determines if there are any zones remaining (step 608). If so, the system sets the current zone to be the zone with the next highest priority (step 609). The system then returns to step 602 to repeat the process of steps 602–610. If no zones remain at step 608, the process is complete.

If a coloring conflict is detected at step 606, one or more different conflict resolution procedures can be used, see above. In one embodiment, the system removes the phase shifters for the current zone (step 610) and the process is complete, e.g. no further zones are processed. Note that once the system removes phase shifters for the current zone, only phase shifters for preceding zones remain. These phase shifters for preceding zones have already passed through a preceding coloring operation and conflict check. Hence, at this point, no coloring conflict exists in the phase shifter placement.

At step 610, the system can optionally change one or more zone-specific phase shifting parameters for the current zone (step 612), and can return to step 602 to redo the placement for the current zone. For example, the system can reduce the phase shifter width for the current zone before returning to redo the phase shifter placement. In still other embodiments, specific phase shifters may be reduced in size, removed and/or presented to a user for manual review and handling to remove the conflict, e.g. if the number of shifters causing conflicts is small, e.g. <1% of shifters in zone.

During the process outlined above, phase shifters are placed for as many zones as possible before a coloring conflict halts placement of phase shifters for subsequent zones.

In another embodiment of the invention, if a feature (of any zone) which cannot be phase-shifted is not a "critical" feature, the system continues placing phase shifters for additional zones. This is possible because it is not required for all features to be phase-shifted, so long as we can point to locations/features where we have conflicts.

Exemplary Layout

Figure 7:
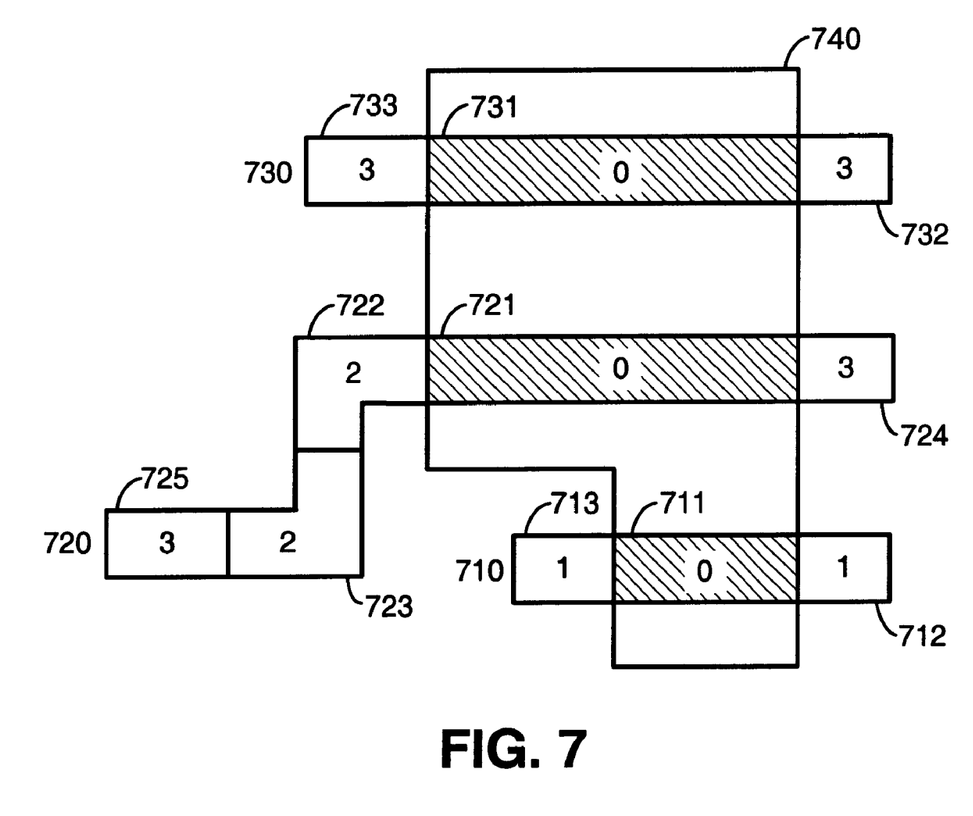
FIG. 7 illustrates an exemplary layout that is divided into phase shifting zones in accordance with an embodiment of the invention.

FIG. 7 illustrates an exemplary layout that is divided into phase shifting zones in accordance with an embodiment of the invention. This exemplary layout is produced using the following set of zone definition rules.

(0) Zone 0 includes all transistor gate regions.

(1) Zone 1 includes all straight polysilicon lines within 200 nm of a "short" gate that is shorter than 200 nm.

(2) Zone 2 includes all polysilicon lines with turns that are within 100 nm of zone 0, zone 1 and zone 2 regions.

(3) Zone 3 includes all critical dimension polysilicon features that do not belong to zone 0, zone 1, zone 2 and zone 3. Critical dimension features are features that are smaller than a pre-specified dimension.

The exemplary layout illustrated in FIG. 7 includes polysilicon lines 710, 720 and 730 and diffusion region 740.

Polysilicon line 710 includes a gate region 711 that defines a short gate (<200 nm in length). This gate region 711 is assigned to zone 0. Polysilicon line 710 also includes remaining polysilicon line portions 712 and 713 that extend beyond gate region 711. These remaining polysilicon line portions 712 and 713 are assigned to zone 1.

Polysilicon line 720 includes a gate region 721, which is assigned to zone 0. It also includes a turn 722, which is within 100 nm of gate region 721. Turn 722 is assigned to zone 2. Note that the next turn 723 in polysilicon line 720 also is assigned to zone 2 because it is within 100 nm of turn 722, which is itself a zone 2 region. This is an example of a zone definition that is recursive. If subsequent adjacent turn existed in polysilicon line 720, this subsequent turn would also be assigned to zone 2. The remaining portions 724 and 725 of polysilicon line 720 are not within zones 0, 1 or 2, but nevertheless are critical dimensions features. Hence, these remaining portions 724 and 725 are assigned to zone 3.

Polysilicon line 730 includes a gate region 731, which is assigned to zone 0. The remaining portions 732 and 733 of polysilicon line 730 are not within zones 0, 1 or 2, but nevertheless have are critical dimension features. These remaining portions 732 and 733 are assigned to zone 3.

The foregoing description is presented to enable one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

The foregoing descriptions of embodiments of the invention have been presented for purposes of illustration and description only. They are not intended to be exhaustive or to limit the invention to the forms disclosed. Accordingly, many modifications and variations will be apparent. Additionally, the above disclosure is not intended to limit the invention. The scope of the invention is defined by the appended claims.

What is claimed is:

1. A method for selectively varying how much of a layout of an integrated circuit is defined by phase shifters during an optical lithography process used in manufacturing the integrated circuit, comprising:

receiving a specification of the layout of the integrated circuit;

assigning features within the layout to zones associated with different phase shifting priorities; and generating a phase shifter placement by placing phase shifters comprised of phase shifting geometries on a phase shifting mask to define the features within the layout;

wherein the phase shifter placement is subject to coloring constraints; and wherein if coloring constraints cannot be satisfied, the method further comprises resolving conflicts and/or removing features from being phase-shifted based upon phase shifting priorities of the zones.

2. The method of claim 1, further comprising:

receiving a phase shifting level from a user interface element; and using the phase shifting level to determine which zones are subject to phase shifting.

3. The method of claim 2, wherein the user interface element can include:

a slider;

a set of buttons;

a pulldown menu; and an input field.

4. The method of claim 1, wherein assigning the features within the layout to zones involves applying a set rules that specify how to assign features to zones.

5. The method of claim 4, wherein assigning features to zones involves assigning features to zones based on at least one of:

feature type;

feature dimension;

feature interaction with layer; and feature proximity to predefined features.

6. The method of claim 1, wherein placing the phase shifters involves using a phase shifter width associated with a phase shifting zone.

7. The method of claim 1, further comprising:

performing a coloring operation to determine whether the phase shifter placement causes a phase shifter conflict; and if a phase shifter conflict is detected, scaling back the phase shifter placement to eliminate the phase shifter conflict.

8. The method of claim 7, wherein scaling back the phase shifter placement involves removing phase shifters from a zone of lowest priority that has been phase shifted.

9. The method of claim 7, wherein scaling back the phase shifter placement involves changing placement parameters for one or more phase shifting zones.

10. The method of claim 7, wherein placing phase shifters involves iteratively placing phase shifters for zones starting with a zone of highest priority and proceeding in descending priority order to zones of lower priority until a coloring conflict is encountered.

11. The method of claim 1, further comprising:
running a test mask through the optical lithography process to produce test results;
using the test results to generate a set of rules specifying how to assign features to zones; and
using the test results to generate phase shifter widths for each of the zones.

* * * * *